(12) United States Patent
Ezura et al.

(10) Patent No.: US 6,348,840 B2
(45) Date of Patent: Feb. 19, 2002

(54) METHOD OF MANUFACTURING A YIG OSCILLATOR

(75) Inventors: Tomohiko Ezura; Shuji Nojima, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/866,318

(22) Filed: May 24, 2001

Related U.S. Application Data

(62) Division of application No. 09/343,332, filed on Jun. 30, 1999, now Pat. No. 6,259,331.

(30) Foreign Application Priority Data

Jun. 30, 1998 (JP) ............................................. 10-184652

(51) Int. Cl.⁷ ............................. H03B 5/18; H01P 1/217; H01L 21/00
(52) U.S. Cl. ................. 331/96; 331/117 D; 331/177 R; 333/219.2; 438/3
(58) Field of Search .............................. 331/96, 107 DP, 331/117 D, 177 R; 333/219.2; 438/3

(56) References Cited

U.S. PATENT DOCUMENTS

| | | | |
|---|---|---|---|
| 3,576,503 A | * | 4/1971 | Hanson ........................ 331/96 |
| 5,424,698 A | * | 6/1995 | Dydyk et al. ............. 333/219.2 |
| 5,801,591 A | * | 9/1998 | Parrott ........................ 331/96 |

FOREIGN PATENT DOCUMENTS

JP        61003501      *  9/1986

OTHER PUBLICATIONS

Heyman, et al.; "Microcircuits for the HP 83750 Series Sweepers" Hewlett–Packard Journal, vol. 44, No. 2, Apr. 1993, pp. 46–51.*

* cited by examiner

*Primary Examiner*—Siegfried H. Grimm
(74) *Attorney, Agent, or Firm*—David N. Lathrop, Esq.; Gallagher & Lathrop

(57) ABSTRACT

A variable-tuned type YIG oscillator accompanied with substantially no mechanical variations in the resonance circuit and a method of manufacturing the same are provided. An amplifier element, electrode, circuit pattern and others of the oscillator circuit portion of a YIG oscillator are integrated on the front face of a semiconductor substrate by the monolithic microwave integrated circuit manufacturing technique. A coupling loop is formed as a thick film conductor shaped so as to surround at least a portion of the outer periphery of a YIG crystal ball on the semiconductor substrate having the amplifier element, electrode, circuit pattern and others formed thereon. A hole for positioning a YIG crystal ball at a predetermined position inside of the coupling loop is formed in the semiconductor substrate from the front surface of the substrate, and the YIG crystal ball is fitted and fixed in the hole.

12 Claims, 4 Drawing Sheets

PRIOR ART

METHOD OF MANUFACTURING A YIG OSCILLATOR

CROSS-REFERENCE TO A RELATED APPLICATION

This application is a division of U.S. non-provisional application Ser. No. 09/343,332 filed Jun. 30, 1999 and now U.S. Pat. No. 6,259,331.

BACKGROUND OF THE INVENTION

1. Field of the Invention

The present invention relates generally to a YIG (yttrium iron garnet) oscillator and a method of manufacturing the same and, more particularly, to a broadband variable-tuned type YIG oscillator utilizing a YIG crystal as a resonator and a method of manufacturing the same.

2. Description of the Related Art

One example of the conventional variable-tuned type YIG oscillator utilizing a YIG crystal (YIG device) as a resonator is illustrated in FIG. 6 which shows particularly the resonance circuit portion, in an enlarged view, of the variable-tuned type YIG oscillator. The illustrated YIG oscillator comprises a substrate 4 having predetermined circuit patterns (metallic layers) 6 formed thereon which comprise the wiring of the oscillator circuit, a YIG crystal 1 having a ball-like shape in this example (hereinafter referred to as YIG crystal ball) separate from the substrate 4 and located at a predetermined position on the substrate 4, and amplifier element 2 separate from the substrate 4 and also located at a predetermined position on the substrate 4. The substrate having predetermined circuit patterns (metallic layers) formed thereon such as the substrate 4 is hereinafter referred to as "circuited substrate".

Fixed to the YIG crystal ball 1 is a support rod 11 which determines the location of the YIG crystal ball 1 on the circuited substrate 4. Further, the amplifier element 2, which has three terminals in this example, has its three terminals electrically connected by wire bonding to the associated three circuit patterns 6 formed around the amplifier element 2. That is, the terminals of the amplifier element 2 are electrically connected to the circuit patterns 6 through the bonding wires 5.

Surrounding the YIG crystal ball 1 in spaced relation therewith is a generally semicircular coupling loop (conductor wiring for electrically and magnetically coupling between the YIG crystal ball 1 and the electric circuit) 3, the opposite ends of which are electrically connected as by soldering to the circuit patterns 6 formed around the YIG crystal ball 1. Through this coupling loop 3, the YIG crystal ball 1 is electromagnetically coupled to the wiring of the oscillator circuit including the amplifier element 2. More specifically, the coupling loop 3 and the YIG crystal ball 1 are magnetically coupled with each other, and the coupling loop 3 is electrically coupled to the wiring of the oscillator circuit. The coupling loop 3 thus serves as a conductor for magnetic resonance and electrical connection.

Since the variable-tuned type YIG oscillator is an oscillator which will generate signals with frequencies in the extremely high frequency microwave range, it is to be noted that parasitic components in the resonance circuit have significant effects on the oscillating characteristics. With the prior art variable-tuned type YIG oscillator as constructed as described above, the resonance circuit has been heretofore formed by the following assembly and wiring operations involving:

(1) fixing the YIG crystal ball 1 to the support rod 11 which is a support member;

(2) locating the amplifier element 2 at a predetermined position on the circuited substrate 4 and electrically connecting its three terminals to the corresponding circuit patterns 6 respectively which constitute the wiring of the oscillator circuit;

(3) locating the semicircular coupling loop 3 at a predetermined position on the circuited substrate 4 and electrically connecting the opposite ends of the coupling loop 3 to the corresponding circuit patterns 6 respectively; and (4) locating the YIG crystal ball 1 inside of the semicircular coupling loop 3 by means of the support rod 11 and adjusting the position of the ball, followed by fixing the support rod 11 to the circuited substrate 4 to thereby fix the YIG crystal ball 1 in place.

It can thus be understood that the conventional operations of locating the separate coupling loop 3 and amplifier element 2 on the circuited substrate 4 and then electrically connecting them to the circuit patterns 6 by soldering and wire bonding as discussed above have been inevitably accompanied in the process of manufacture with mechanical variations or unevenness in the position of connection of the bonding wires 5, the position of connection of the coupling loop 3 and the relative position between the YIG crystal ball 1 and the coupling loop 3.

Particularly, the position of connection of the coupling loop 3 and the relative position between the YIG crystal ball 1 and the coupling loop 3 are attended with wider mechanical variations or unevenness as compared to the position of connection of the bonding wires 5.

These mechanical variations in turn cause variations in parasitic components in the resonance circuit. The higher the oscillating frequencies of the oscillator, the greater the effects the parasitic components will exert on the oscillating characteristics of the oscillator. Especially in the oscillator such as the YIG oscillator which produce frequencies in the microwave range, even a slight variation in the parasitic components can possibly lead to a significant change in the oscillating characteristics of the oscillator. Since even slight mechanical variations in manufacture can exert significant influences on the oscillating characteristics of the oscillator, it is thus to be understood that the conventional YIG oscillator had the drawback of low manufacturing yields.

SUMMARY OF THE INVENTION

Accordingly, it is an object of the present invention to provide a method of manufacturing a variable-tuned type YIG oscillator accompanied with substantially no mechanical variations in the resonance circuit.

It is another object of the present invention to provide a method of manufacturing a variable-tuned type YIG oscillator which allows for improving manufacturing yields of YIG oscillators.

It is still another object of the present invention to provide a variable-tuned type YIG oscillator substantially free from mechanical variations in the resonance circuit.

It is yet another object of the present invention to provide a variable-tuned type YIG oscillator requiring substantially no operations for assembly and wiring of the resonance circuit.

In order to accomplish the aforesaid objectives, in a first aspect of the present invention, a method of manufacturing a YIG oscillator is provided which comprises the step of forming a coupling loop of a thick film conductor on a substrate having a predetermined circuit pattern formed thereon; the step of forming a hole for positioning a YIG crystal at a predetermined position inside of the coupling loop in the substrate from the front surface of the substrate; and the step of fitting the YIG crystal ball in the hole.

In a first preferred embodiment, the substrate is a semiconductor substrate, and the method includes the step of integrating active elements, passive elements, the circuit pattern, and the coupling loop of the oscillator circuit portion of the YIG oscillator monolithically on the face of the semiconductor substrate by the monolithic microwave integrated circuit manufacturing technique.

The circuit pattern is formed by photoetching technique as a predetermined- pattern on the semiconductor substrate having the active elements and the passive elements integrated thereon, the coupling loop is, after the formation of the circuit pattern, formed as a thick film conductor shaped so as to surround at least a portion of the outer periphery of the YIG crystal on the semiconductor substrate.

The coupling loop is formed by electrolytic plating process as a thick film conductor on one circuit pattern formed on the semiconductor substrate.

The hole is formed by etching technique on the semiconductor substrate having the active elements, the passive elements, the circuit pattern and the coupling loop monolithically integrated thereon from above the front surface of the substrate.

The method may further include the step of reducing the thickness of the semiconductor substrate by polishing the back surface of the substrate.

In a second preferred embodiment, the substrate is a dielectric substrate, and the method includes the step of mounting active elements and passive elements of the oscillator circuit portion of the YIG oscillator on the face of the dielectric substrate, the step of forming the circuit pattern as a predetermined pattern on the dielectric substrate having the active elements and passive elements mounted thereon, and the step of forming the coupling loop as a predetermined shape on the dielectric substrate having the active elements and passive elements mounted thereon.

The circuit pattern is formed by photoetching technique as a predetermined pattern on the dielectric substrate having the active elements and the passive elements mounted thereon, and the coupling loop is, after the formation of the circuit pattern, formed as a thick film conductor shaped so as to surround at least a portion of the outer periphery of the YIG crystal on the dielectric substrate.

The coupling loop is formed by electrolytic plating process as a thick film conductor on one circuit pattern formed on the dielectric substrate.

The hole is formed by etching technique in the dielectric substrate having the active elements, the passive elements, the circuit pattern and the coupling loop integrated as a hybrid integrated circuit thereon from above the front surface of the substrate.

The method may further include the step of reducing the thickness of the dielectric substrate by polishing the back surface of the substrate.

In each of the embodiments described above, the method may include the step of maintaining the environment surrounding the substrate at a predetermined temperature prior to the step of fitting the YIG crystal in the hole.

In a second aspect of the present invention, a YIG oscillator is provided which comprises a substrate having active elements, passive elements, a circuit pattern and a coupling loop integrated thereon to form the oscillator circuit portion of the YIG oscillator; a hole for positioning a YIG crystal at a predetermined position inside of the coupling loop, the hole being formed in the substrate from the front surface of the substrate; and a YIG crystal fitted in the hole.

In a first preferred embodiment, the substrate is a semiconductor-substrate, and the semiconductor substrate has the active elements, the passive elements, the circuit pattern, and the coupling loop of the oscillator circuit portion of the YIG oscillator integrated monolithically on the face thereof by the monolithic microwave integrated circuit manufacturing technique.

The circuit pattern is formed by photoetching technique as a predetermined pattern on the semiconductor substrate having the active elements and the passive elements integrated thereon., and the coupling loop is formed as a thick film conductor shaped so as to surround at least a portion of the outer periphery of the YIG crystal on the semiconductor substrate.

The coupling loop is formed by electrolytic plating process as a thick film conductor on one circuit pattern formed on the semiconductor substrate.

The hole is formed by etching technique on the semiconductor substrate having the active elements, the passive elements, the circuit pattern and the coupling loop monolithically integrated thereon from above the front surface of the substrate.

In a second preferred embodiment, the substrate is a dielectric substrate. The active elements and the passive elements of the oscillator circuit portion of the YIG oscillator are mounted on the face of the dielectric substrate, and the circuit pattern is formed as a predetermined pattern on the dielectric substrate having the active elements and passive elements mounted thereon, and the coupling loop is formed as a predetermined shape on the dielectric substrate having the active elements and passive elements mounted thereon.

The circuit pattern is formed by photoetching technique as a predetermined pattern on the dielectric substrate having the active elements and passive elements mounted thereon, and the coupling loop is formed as a thick film conductor shaped so as to surround at least a portion of the outer periphery of the YIG crystal on the dielectric substrate.

The coupling loop is formed by electrolytic plating process as a thick film conductor on one circuit pattern formed on -the dielectric substrate.

The hole is formed by etching technique in the dielectric substrate having the active elements, the passive elements, the circuit pattern and the coupling loop integrated as a hybrid integrated circuit thereon from above the front surface of the substrate.

The YIG oscillator constructed as set forth above may be used with spectrum analyzers, network analyzers and the like, whereby the analyzing accuracy of the equipment may be markedly improved.

DETAILED DESCRIPTION OF THE PREFERRED EMBODIMENTS

Figure 1:
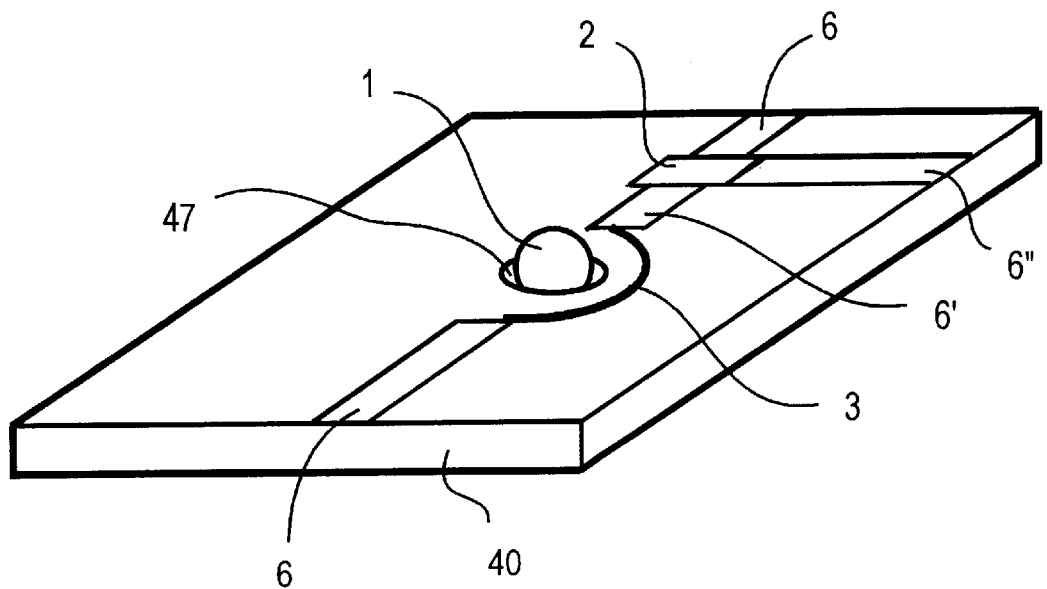
FIG. 1 is a schematic perspective illustration showing the construction of the resonance circuit portion of an embodiment of the YIG oscillator according to the present invention.
Figure 6:
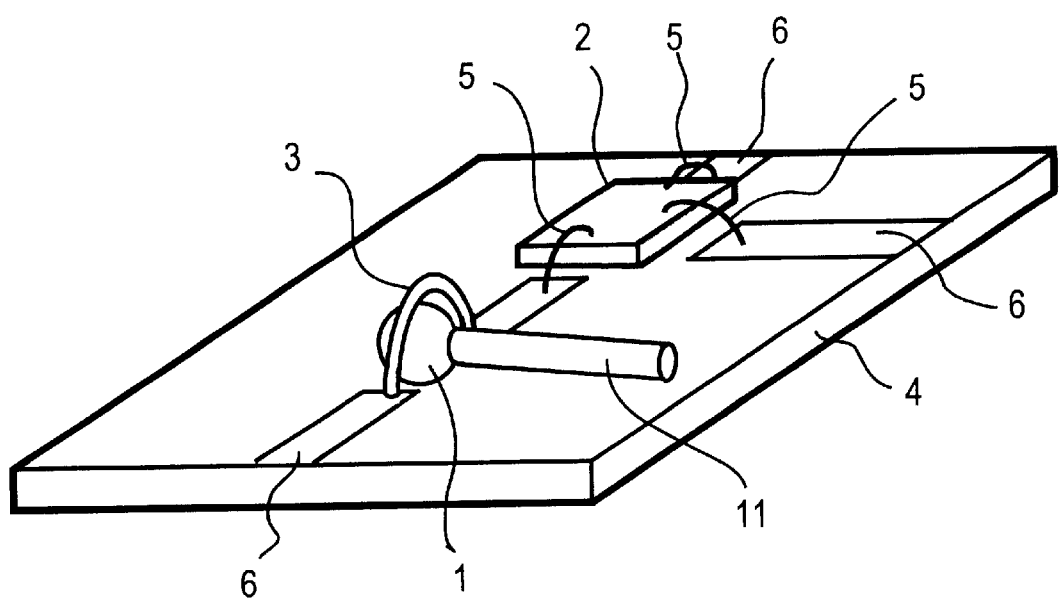
FIG. 6 is a schematic perspective illustration showing the construction of the resonance circuit portion of one example of the prior art variable-tuned YIG oscillator.

Preferred embodiments of the present invention will now be described in detail with reference to the appended drawings. In FIG. 1, those elements and components which correspond to those shown in FIG. 6 are indicated by like reference numerals and will not be discussed again unless required.

In one embodiment, the present invention utilizes the technique of manufacturing monolithic microwave integrated circuits (MMIC) to make the resonance circuit portion except the YIG crystal of a variable-tuned type YIG oscillator integrally as a monolithic integrated circuit (which will be hereinafter referred to as monolithic IC) for the purpose of forming a variable-tuned type YIG oscillator substantially free from mechanical variations in manufacture.

Application of the MMIC producing technique makes it possible to monolithically form the amplifier element, coupling loop and substrate of the major elements and components which comprise a variable-tuned type YIG oscillator and in addition allows for simultaneously forming a hole for positioning the YIG crystal, by the use of the semiconductor producing process having a high mechanical precision and reproducibility.

FIG. 1 is a schematic perspective illustration showing the construction of the resonance circuit portion of an embodiment of the YIG oscillator according to the present invention. This YIG oscillator comprises a substrate 40 having predetermined circuit patterns (metallic layers) 6, 6', 6" formed thereon which comprise the wiring of the oscillator circuit, a YIG crystal 1 having a ball-like shape in this embodiment (hereinafter referred to as YIG crystal ball) located at a predetermined position on the substrate 40, a semicircular coupling loop 3 located in proximity around the YIG crystal ball 1, and an amplifier element 2 also located at a predetermined position on the substrate 40. The substrate having predetermined circuit patterns (metallic layers) formed thereon such as the substrate 40 is hereinafter referred to as "circuited substrate".

In this embodiment of the invention, all of the elements and components but the YIG crystal ball 1 that constitute the resonance circuit portion shown in FIG. 1 are made as a monolithic IC.

In order to accomplish this objective, the circuited substrate 40 is formed from one type of semiconductor crystalline substrate, the amplifier element 2 is formed on the circuited substrate 40 so as to be electrically connected with the adjacent circuit patterns 6, 6', 6" by the semiconductor producing technique, and the coupling loop 3 is also formed on the circuited substrate 40 so as to be electrically connected with the adjacent circuit patterns 6, 6', 6" by the semiconductor producing technique. In addition, the circuited substrate 40 has a hemispherical hole 47 formed therein for positioning the YIG crystal ball 1, which is fitted in a fixed state in this hole 47.

Next, the method of manufacturing the YIG oscillator constructed as described above according to the present invention will be explained with reference to FIGS. 2–5.

Figure 2:
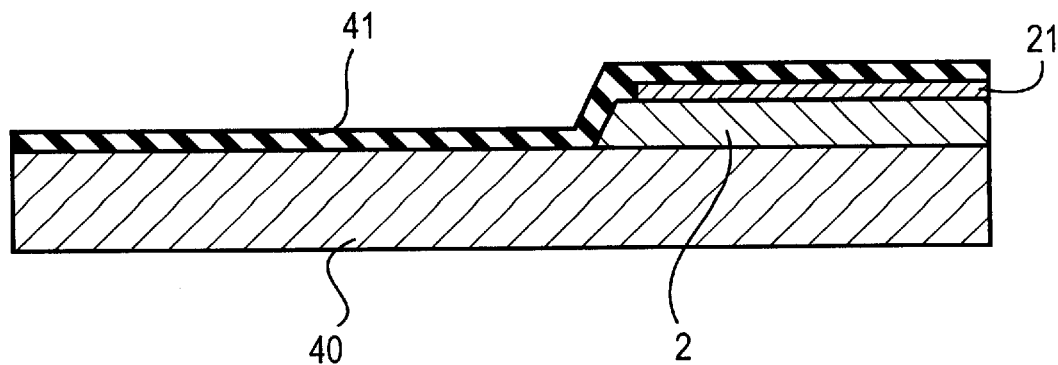
FIG. 2 is a schematic cross-sectional view illustrating active elements and passive elements of the YIG oscillator shown in FIG. 1 having been formed on a circuited substrate.

FIG. 2 is a schematic cross-sectional view illustrating the process of forming the amplifier element 2 and electrode 21 of the YIG oscillator shown in FIG. 1 on the circuited substrate 40. In this step, the amplifier element 2 and electrode 21 are formed successively on the circuited substrate 40 by the conventional MMIC producing technique, and then the entire surface of the circuited substrate 40 including the amplifier element 2 and electrode 21 is covered with an interlayer electrically insulating film 41 which may be composed of silicon nitride SiN.

In the next step, as will be appreciated from FIG. 3 (a) in order to form the coupling loop 3, a first photoresist layer 42 is applied to the entire surface of the interlayer electrically insulating film 41 shown in FIG. 2, followed by being exposed to light with a predetermined pattern. Then, unexposed portions of the first photoresist layer 42 are removed together with the underlying portions of the interlayer electrically insulating film 41 by dry etching, for example, whereby that portion of the circuited substrate 40 for forming the coupling loop 3 and a substantial portion of the electrode 21 on the amplifier element 2 become exposed. It is to be noted that while the opposite end portions of the interlayer electrically insulating film 41 are shown as remaining with the overlying portions of the photoresist layer 42 in the illustrated example, actually they remain in the form of a predetermined pattern.

Figure 3A:
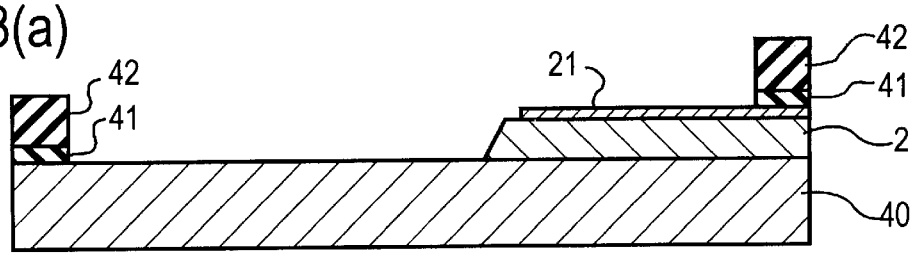
FIGS. 3(a) to 3(e) are illustrations illustrating sequential steps of forming a circuit pattern and a coupling loop of the YIG oscillator shown in FIG. 1 on a circuited substrate, in which (a) is a schematic cross-sectional illustration illustrating the step of applying a first layer of photoresist, forming a pattern and effecting the etching process, (b) is a schematic cross-sectional illustration illustrating the step of forming a metallic thin film for the circuit pattern, (c) is a schematic cross-sectional illustration illustrating the step of applying a second layer of photoresist and forming a patter, (d) is a schematic cross-sectional illustration illustrating the step of forming a coupling loop, and (e) is a schematic cross-sectional illustration illustrating the lift-off step.
Figure 3B:
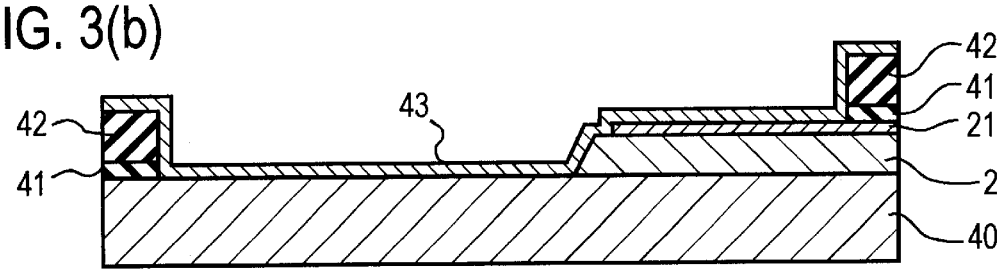
Figure 3C:
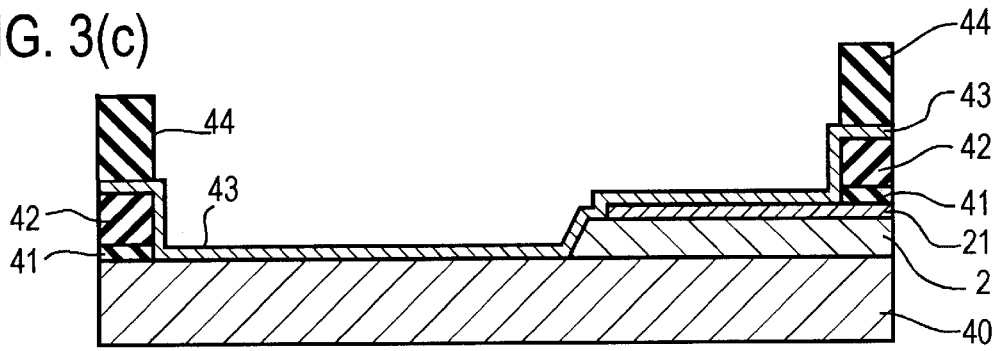

In the next step as shown in FIG. 3(b), a conductor layer 43 composed of metallic thin film such as TiAu for the circuit pattern which will ultimately comprise the wiring of the oscillator circuit is deposited over the entire surface of the circuited substrate 40 in the state shown in FIG. 3(a) by sputtering deposition, for example. Over the entire surface of the metallic thin film conductor layer 43, as will be appreciated from FIG. 3(c), a second photoresist layer 44 is deposited, followed by being exposed to light with a predetermined pattern. Then, unexposed portions of the second photoresist layer 44 are removed together with the underlying portions of the thin film conductor layer 43 by dry etching, for example, whereby the thin film conductor layer 43 becomes exposed except for its opposite end portions in the illustrated example. It is to be noted that while the thin film conductor layer 43 is shown as its opposite end portions remaining in FIG. 3(c), it is seen when the circuited substrate 40 is viewed in a top plan view that those portions of the thin film conductor layer 43 which are shown as circuit patterns 6, 6', 6" in FIG. 1 and those semicircular portions of the conductor layer underlying the coupling loop 3 remain unremoved.

Figure 3D:
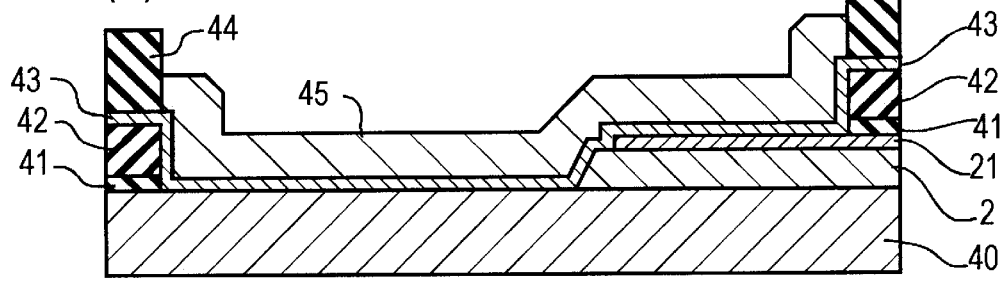
Figure 3E:
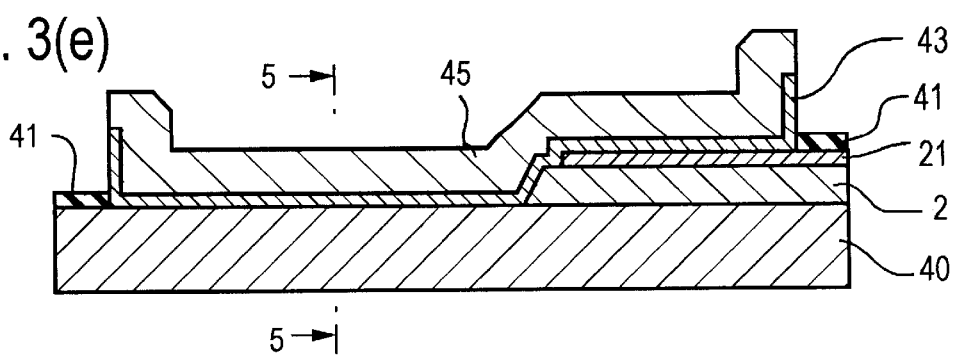

Then, as shown in FIG. 3(d), a conductor layer 45 composed of thick film of highly conductive metal is formed on the surface of thin film conductor layer 43 by electrolytic plating process. In this example, gold is deposited thick onto the exposed surface of conductor layer 43 by electrolytic plating process to form the thick film conductor layer 45. Next, as shown in FIG. 3(e), those portions of the first photoresist layer 42, the thin film conductor layer 43 and the second photoresist layer 44 overlying the opposite end portions of the interlayer electrically insulating film 41 are removed by lifting-off (the process of melting the photoresist layer away to remove the overlying thin film conductor layer 43 in this example).

It will be appreciated that the manufacturing process as illustrated in FIGS. 3(a) to 3(e) provides for forming the coupling loop 3 shown in FIG. 1 as a semicircular thick film conductor layer 45 integrally on the circuited substrate 40 as well as forming wirings 6, 6', 6" in a predetermined pattern.

Since the coupling loop 3 is an element for magnetically coupling with the YIG crystal ball 1, it is required to make the thickness of the conductor as thick as possible. It is for this reason that the thick film conductor layer 45 as noted above is formed by the use of electrolytic plating process. In this regard, while the thick film conductor layer 45 is shown as formed to extend over the electrode 21 overlying the amplifier element 2 in the illustrated example, it is needless to be said that the conductor layer 45 may need be formed so as to surround only semicircularly the YIG crystal ball 1 as shown in FIG. 1. In addition, in the embodiment of FIG. 1 in which the amplifier element 2 is of a three terminal type and is generally square in shape, the amplifier element 2 has circuit patterns 6, 6', 6" formed along its peripheral three sides to which circuit patterns three respective terminals are connected. It should of course be understood that this is only an example and that various fashions of connection may be employed depending on the shape and the number of terminals of the amplifier element 2.

Figure 4:
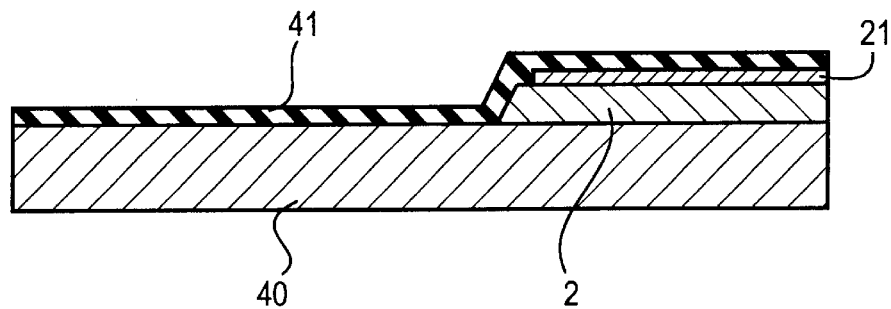
FIG. 4 is a schematic cross-sectional view illustrating the back surface of the circuited substrate of the YIG oscillator shown in FIG. 1 having been polished to reduce the thickness of the circuited substrate.

Since a high frequency circuit such as MMIC is designed in consideration of the dielectric constant of the circuited substrate 40, the substrate is usually thinned to a thickness on the order of 100–150 mm by polishing the back surface of the circuited substrate. FIG. 4 illustrates the YIG oscillator according to the present invention of which the back surface has been thinned by polishing process. This process of polishing the back surface of the circuited substrate may be carried out either prior to the process of forming the coupling loop 3 and the circuit patterns as shown in FIGS. 3(a) to 3(e) or at the completion of the process shown in FIGS. 3(a) to 3(e).

After the coupling loop 3 and the circuit patterns 6, 6', 6" have been formed as described above, a positioning hole 47 for fittingly receiving the YIG crystal ball 1 therein is formed in the circuited substrate 40 from its front surface side.

When manufacturing MMICs, it has been heretofore a common practice to employ the process of forming via holes in the back surface of the semiconductor substrate by etching and plating the inner peripheral wall surface of the via holes. In contrast, according to the present invention such via hole etching process is adapted as such for forming a hole 47 for positioning the YIG crystal ball 1 in the surface of the circuited substrate 40.

Figure 5A:
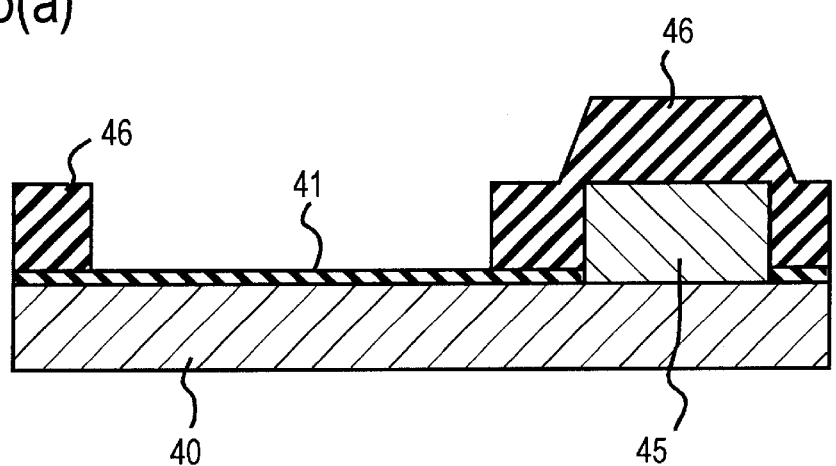
FIG. 5 is an illustration illustrating the process of forming a hole for fixing a YIG crystal of the YIG oscillator shown in FIG. 1, in which (a) is a schematic cross-sectional illustration illustrating the step of applying a photoresist and forming a pattern and (b) is a schematic cross-sectional illustration illustrating the step of etching and lifting off the photoresist.
Figure 5B:
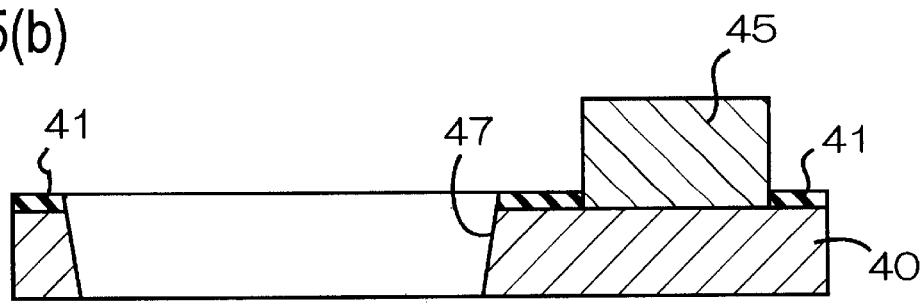

FIGS. 5(a) and 5(b) are schematic cross-sectional views taken along the line 5—5 in FIG. 3(e) and viewed in the direction of the arrows. Over the entire surface of the circuited substrate 40 having the thick film conductor layer 45 (coupling loop 3) and the circuit patters 6, 6', 6" formed thereon by the processes illustrated up to FIG. 3(e), as will be appreciated from FIG. 5(a), a third photoresist layer 46 is applied, followed by being exposed to light with a predetermined pattern. Then, unexposed portions of the photoresist layer 46 are removed by dry etching, for example, whereby that portion of the photoresist layer 46 in which a YIG crystal ball positioning hole 47 is to be formed is removed.

In the next step, the surface of the circuited substrate 40 in the state shown in FIG. 5(a) is subjected to dry etching, for example, whereby that portion of the interlayer electrically insulating film 41 and the underlying portion of the circuited substrate 40 are removed to form a YIG crystal ball positioning hole 47 (a through hole in this example) as shown in FIG. 5(b). Then, the photoresist layer 46 is removed by lifting-off process. It will be appreciated that the positioning hole 47 in which the YIG crystal ball 1 is to be fitted and positioned may thus be formed at a predetermined-position in the circuited substrate 40 with a high precision and reproducibility. It is needless to say that the hole 47 has an inner peripheral surface substantially conforming with the outside shape of the YIG crystal ball 1.

As discussed above, this embodiment of the invention utilizes the MMIC manufacturing technique having a high mechanical precision and reproducibility to integrate the amplifier element 2 and coupling loop 3 of the major elements and components which comprise a variable-tuned type YIG oscillator as a monolithic IC on the semiconductor circuited substrate 40 as well as to form the hole 47 for positioning the YIG crystal ball 1 on the circuited substrate 40. It can thus be appreciated that the present invention allows for forming the amplifier element 2 and coupling loop 3 at predetermined positions on the circuited substrate 40 without mechanical variations. Moreover, the YIG crystal ball 1 positioning hole 47 may also be formed in the circuited substrate 40 with a high precision. Consequently, the YIG crystal ball 1 may be fitted and fixed in the positioning hole 47 accurately formed in the circuited substrate 40.

As is apparent from the foregoing description, it can be seen that this embodiment eliminates the need that the operator locate the YIG crystal ball 1 inside of the coupling loop 3 by grasping the support rod 11 attached to the YIG crystal ball 1 and manually fine adjust the position of the YIG crystal ball for adjusting the magnetic coupling thereof with the wiring of the oscillator circuit. This allows for greatly facilitating the positioning of the YIG crystal ball 1, resulting in a significant improvement in workability. In addition, since the coupling loop 3 is formed as a circuit pattern on the circuited substrate 40, the precision in positioning the coupling loop is extremely high as compared to the prior art example and yet such positioning may be reproduced with high accuracy. The precision in positioning the YIG crystal ball 1 relative to the coupling loop 3 is also significantly enhanced as compared to the prior art example, because the YIG crystal ball 1 is fitted and fixed in the positioning hole 47 formed by etching. Furthermore, elimination of the need for locating the amplifier element 2 and coupling loop 3 as separate parts at predetermined positions on the circuited substrate 40 and electrically connecting them to the associated parts leads to eliminating the requirement of bonding and soldering operations and hence bonding wire material. Consequently, there would occur no manufacturing variations whatsoever due to bonding wire.

As already indicated hereinbefore, mechanical variation in position of connection of connection of the coupling loop 3 and the relative position between the YIG crystal ball 1 and the coupling loop 3 is the greatest cause for varying parasitic components in the resonance circuit. Accordingly, if the coupling loop 3 is formed as a circuit pattern on the circuited substrate 40 and the position of the YIG crystal ball 1 relative to the coupling loop 3 is determined by the positioning hole 47 accurately formed by etching as in this embodiment, variations in manufacturing YIG oscillators is minimized, resulting in substantially eliminating variations in parasitic components, which in turn contributes to uniform oscillating characteristics of the thus manufactured YIG oscillators. On top of that, this embodiment provides the advantage of markedly improving manufacturing yields of YIG oscillators by completely eliminating manufacturing variations due to bonding wire.

It should be noted here that while the positioning hole 47 for the YIG crystal ball 1 is illustrated as a through hole in this embodiment, it may be a blind hole that does not extend through the circuited substrate 40. In addition, the YIG crystal ball 1 is not always spherical in shape, so that the configuration of the positioning hole 47 to be formed in the circuited substrate 40 may also be varied depending on the shape of YIG crystal ball 1.

Moreover, in view of the fact that the YIG crystal ball 1 can vary in its characteristic and shape due to changes in temperature, it is preferable that when fitting and fixing the YIG crystal ball 1 in the positioning hole 47, the ambient temperature be maintained constant by heating means such as electric heaters disposed in the vicinity of and/or underneath the back surface of the circuited substrate 40.

While the embodiment described above utilizes the MMIC manufacturing technique to make the resonance circuit portion except the YIG crystal ball 1 of the variable-tuned type YIG oscillator integrally as a monolithic integrated circuit to thereby form a variable-tuned type YIG oscillator substantially free from mechanical variations in manufacture, it can be appreciated that the MMIC (Hybrid Microwave Integrated Circuit) manufacturing technique may also be utilized to make the resonance circuit portion except the YIG crystal ball 1 of the variable-tuned type YIG oscillator integrally as a hybrid integrated circuit to thereby form a variable-tuned type YIG oscillator substantially free from mechanical variations in manufacture.

In this instance, a dielectric substrate such as an alumina substrate is used as a circuited substrate 40, on which predetermined circuit patterns are formed by the use of the semiconductor producing technique, and an amplifier element 2 is mounted at a predetermined position on the circuited substrate 40. A coupling loop 3 is formed on the circuited substrate 40 so as to be electrically connected with the adjacent circuit patterns by the semiconductor producing technique. The next step is to form a hole 47 for positioning a YIG crystal ball 1 in the circuited substrate 40 by etching technique, for example, and then the YIG crystal ball 1 is fitted in a fixed state in this hole 47. It is thus to be appreciated that the variable-tuned type YIG oscillator may be manufactured by the manufacturing method similar to that used in the previously described embodiment, except that the amplifier element 2 is not integrally formed on the circuited substrate.

This embodiment described just above also eliminates the need that the operator locate the YIG crystal ball 1 inside of the coupling loop 3 by grasping the support rod 11 attached to the YIG crystal ball 1 and manually fine adjust the position of the YIG crystal ball for adjusting the magnetic coupling thereof with the wiring of the oscillator circuit. This allows for greatly facilitating the positioning of the YIG crystal ball 1, resulting in a significant improvement in workability. In addition, since the coupling loop 3 is formed as a circuit pattern on the circuited substrate 40 and the position of the YIG crystal ball 1 relative to the coupling loop 3 is determined by the positioning hole 47 accurately formed by etching, variations in manufacturing YIG oscillator is minimized, resulting in substantially no variations in parasitic components, which in turn ensures uniform oscillating characteristics of the thus manufactured YIG oscillators and provides the advantage of markedly improving manufacturing yields of YIG oscillators.

As is apparent from the foregoing descriptions, the variable-tuned type YIG oscillator according to the present invention has minimal variations in manufacture and hence is substantially free from variations in parasitic components. Accordingly, variable-tuned type YIG oscillators manufactured according to the present invention will exhibit consistent oscillating characteristics. Hence, the invention provides the advantage of markedly enhancing manufacturing yields of YIG oscillators. In addition, elimination of the need for the operator maneuvering the support member with the YIG crystal secured thereto to position the YIG crystal inside of the coupling loop and then fine adjusting the position of the YIG crystal to adjust the magnetic coupling thereof greatly facilitates the positioning of the YIG crystal, leading to a significant improvement in workability. In addition, the use of the variable-tuned type YIG oscillator according to the present invention for the spectrum analyzer, network analyzer and the like would provide the advantage of markedly enhancing the performance of the equipment to ensure improved analyzing accuracy.

While the present invention has been described in connection with the preferred embodiment illustrated herein, it will be apparent to those skilled in the art that various changes, alterations and modifications could be made to the embodiment described in the foregoing description without departing from the spirit and scope of the invention. It should be understood, therefore, that the present invention is not limited to the particular embodiment disclosed herein, but is intended to cover all changes, alterations and modifications which are within the spirit and scope of the invention as defined by the appended claims.

What is claimed is:

1. A method of manufacturing a YIG oscillator, comprising:

the step of forming a coupling loop of a thick film conductor on a substrate having a predetermined circuit pattern formed thereon;

the step of forming a hole for positioning a YIG crystal at a predetermined position inside of said coupling loop in said substrate from the front surface of said substrate; and the step of fitting said YIG crystal in said hole.

2. The method as set forth in claim 1 wherein said substrate is a semiconductor substrate, and including the step of integrating active elements, passive elements, said circuit pattern, and said coupling loop of the oscillator circuit portion of the YIG oscillator monolithically on the face of said semiconductor substrate by the monolithic microwave integrated circuit manufacturing technique.

3. The method as set forth in claim 2 wherein said circuit pattern is formed by photoetching technique as a predetermined pattern on said semiconductor substrate having said active elements and said passive elements integrated thereon, said coupling loop being, after the formation of said circuit pattern, formed as a thick film conductor shaped so as to surround at least a portion of the outer periphery of said YIG crystal on said semiconductor substrate.

4. The method as set forth in claim 3 wherein said coupling loop is formed by electrolytic plating process as a thick film conductor on one circuit pattern formed on said semiconductor substrate.

5. The method as set forth in claim 2 wherein said hole is formed by etching technique on said semiconductor substrate having said active elements, said passive elements, said circuit pattern and said coupling loop monolithically integrated thereon from above the front surface of said substrate.

6. The method as set forth in claim 2, further including the step of reducing the thickness of said semiconductor substrate by polishing the back surface of the substrate.

7. The method as set forth in claim 1 wherein said substrate is a dielectric substrate, and including the step of mounting active elements and passive elements of the oscillator circuit portion of the YIG oscillator on the face of said dielectric substrate, and the step of forming said circuit pattern as a predetermined pattern on said dielectric substrate having said active elements and said passive elements mounted thereon, and the step of forming said coupling loop as a predetermined shape on said dielectric substrate having said active elements and said passive elements mounted thereon.

8. The method as set forth in claim 7 wherein said circuit pattern is formed by photoetching technique as a predetermined pattern on said dielectric substrate having said active elements and said passive elements mounted thereon, said coupling loop being after the formation of said circuit pattern, formed as a thick film conductor shaped so as to surround at least a portion of the outer periphery of said YIG crystal on said dielectric substrate.

9. The method as set forth in claim 7 wherein said coupling loop is formed by electrolytic plating process as a thick film conductor on one circuit pattern formed on said dielectric substrate.

10. The method as set forth in claim 7 wherein said hole is formed by etching technique in said dielectric substrate having said active elements, passive elements, said circuit pattern and said coupling loop integrated as a hybrid integrated circuit thereon from above the front surface of said substrate.

11. The method as set forth in claim 7, further including the step of reducing the thickness of said dielectric substrate by polishing the back surface of the substrate.

12. The method as set forth in claim 1, including the step of maintaining the environment surrounding said substrate at a predetermined temperature prior to the step of fitting said YIG crystal in said hole.

* * * * *